United States Patent
Hebert et al.

(10) Patent No.: US 9,893,099 B2
(45) Date of Patent: Feb. 13, 2018

(54) PHOTO SENSOR MODULE

(71) Applicant: MagnaChip Semiconductor, Ltd., Cheongju-si (KR)

(72) Inventors: Francois Hebert, San Mateo, CA (US); Seong Min Choe, Seongnam-si (KR)

(73) Assignee: Magnachip Semiconductor, Ltd., Cheongju-si (KR)

( * ) Notice: Subject to any disclaimer, the term of this patent is extended or adjusted under 35 U.S.C. 154(b) by 0 days.

(21) Appl. No.: 15/263,915

(22) Filed: Sep. 13, 2016

(65) Prior Publication Data

US 2016/0380012 A1   Dec. 29, 2016

Related U.S. Application Data

(62) Division of application No. 14/796,050, filed on Jul. 10, 2015, now Pat. No. 9,576,991.

(30) Foreign Application Priority Data

Aug. 19, 2014  (KR) .................. 10-2014-0107936

(51) Int. Cl.
  *H01L 27/144*    (2006.01)
  *H01L 31/02*     (2006.01)
  *H01L 31/0216*   (2014.01)
  *H01L 31/0368*   (2006.01)
  *H01L 31/0392*   (2006.01)
  *H01L 31/103*    (2006.01)

(52) U.S. Cl.
  CPC .... *H01L 27/1443* (2013.01); *H01L 31/02019* (2013.01); *H01L 31/02164* (2013.01); *H01L 31/03682* (2013.01); *H01L 31/03921* (2013.01); *H01L 31/103* (2013.01)

(58) Field of Classification Search
  CPC ........... H01L 27/1461; H01L 27/14612; H01L 27/14643; H01L 27/14636
  See application file for complete search history.

(56) References Cited

U.S. PATENT DOCUMENTS

| | | | |
|---|---|---|---|
| 6,798,033 B2 * | 9/2004 | Chao | H01L 27/14643 257/226 |
| 7,993,956 B2 * | 8/2011 | Shiu | H01L 31/103 257/458 |
| 8,171,946 B2 | 5/2012 | Blackwell et al. | |
| 8,895,349 B2 * | 11/2014 | Chuang | H01L 27/14643 257/228 |
| 2005/0110094 A1 | 5/2005 | Kuwazawa | |
| 2005/0167709 A1 | 8/2005 | Augusto | |
| 2008/0093695 A1 | 4/2008 | Gao et al. | |
| 2009/0179241 A1 | 7/2009 | Kawai | |

* cited by examiner

Primary Examiner — Cuong Q Nguyen
(74) Attorney, Agent, or Firm — NSIP Law

(57) ABSTRACT

The present disclosure relates to a photo sensor module. The thickness and size of an IC chip may be reduced by manufacturing a photo sensor based on a semiconductor substrate and improving the structure to place a UV sensor on the upper section of an active device or a passive device. The photo sensor module includes a semiconductor substrate, a field oxide layer, formed on the semiconductor substrate, and a photo sensor comprising a photo diode formed on the field oxide layer.

14 Claims, 9 Drawing Sheets

PHOTO SENSOR MODULE

CROSS-REFERENCE TO RELATED APPLICATIONS

This application is a divisional of U.S. patent application Ser. No. 14/796,050 filed on Jul. 10, 2015, which claims the benefit under 35 USC 119(a) of Korean Patent Application No. 10-2014-0107936 filed on Aug. 19, 2014 in the Korean Intellectual Property Office, the entire disclosure of which is incorporated herein by reference for all purposes.

BACKGROUND

1. Field

The following description relates to a photo sensor and to a photo sensor module configuring a UV sensor using poly silicon formed on a semiconductor substrate, which minimizes size of a chip by forming a passive device processing sensing signal in a vertical direction with a UV sensor.

2. Description of Related Art

UV sensing has recently been incorporated in various portable products, such as, for example, smart phone and wearable devices, because of an increase in awareness of protecting people from UV exposure. Such products, which are equipped with a UV sensor, can signal alarm before an end-user harms his or her health during outdoor exercise by measuring accumulated UV exposure concentration. Moreover, a UV sensor in smart phones or wearable devices can operate functions such as, for example, proximity and motion control, and measure UV exposure concentration, heart rate, pulse frequency and blood oxygen level.

Silicon photo diode is generally used as a UV sensor. U.S. Pat. No. 8,071,946 (Multi-function light sensor, registered on Dec. 6, 2011, hereinafter referred to as 'prior document') to Kita ("Kita") is an example of a UV sensor which uses silicon photo diode. Kita is incorporated herein in its entirety by reference in the same manner as when each cited document is separately and specifically incorporated or incorporated in its entirety.

Kita discloses a UV sensor manufactured based on a Silicon on Insulator (SOI) substrate structure. The UV sensor provides a SOI substrate 12 comprising a silicon oxide insulator film 16 and a silicon semiconductor layer 18 configured of single crystal silicon on a silicon substrate 14. An ultraviolet ray sensing UV sensor is formed on the silicon semiconductor layer 18 configuring the SOI substrate 12. A first photo diode and a second photo diode which sense other rays, are formed on a silicon substrate 14 to avoid overlap with a UV sensor. A silicon oxide insulator film separates a first photo diode, a second photo diode, and a UV sensor.

A UV sensor with the above-mentioned structure has some problem. A UV sensor is manufactured formed on a silicon semiconductor layer of a SOI substrate. Moreover, any active device or passive device to process sensing signal is not formed on a lower UV sensor.

This makes it difficult to reduce the size of an IC chip comprising a UV sensor and making it difficult to reduce the size of the smart phones or wearable devices smaller.

Demand for a UV sensor, which can detect UV with high sensitivity while reducing manufacturing cost is increasing. The UV sensors known in the art are not capable of high sensitivity sensing function and being cheaper than a SOI substrate.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

The present disclosure provides a UV sensor which is based on poly silicon formed on a semiconductor substrate.

The present disclosure minimizes size of an IC chip size by improving a structure forming a passive device perpendicular to a UV sensor.

The present disclosure provides one senor module to sense both UV and non-UV.

In one general aspect there is provided a photo senor module including a semiconductor substrate, a field oxide layer, formed on the semiconductor substrate, and a photo sensor including a photo diode formed on the field oxide layer.

The photo sensor module may include a first WELL region and a second WELL region formed on the semiconductor substrate, a first source/drain region formed on the first WELL region and a second source/drain region formed on the second WELL region, an isolation layer formed between the first WELL region and the second WELL region, and a gate insulator film and a gate electrode formed on the first WELL region and another gate insulator film and another gate electrode formed on the second WELL region.

The photo sensor module may include an insulator film formed on the field oxide layer and the gate electrodes, and a passivation layer formed on the insulator film.

A part of the insulator film and the passivation layer may be removed, and a part of the photo diode is exposed to outside.

The photo diode may include two or more doping region formed in a module form to sense UV.

The photo diode may include a first doping region of high concentration, a second doping region of low concentration, doped in a different impurity from the first doping region, and a third doping region of high concentration, doped in an identical impurity as the second doping region.

The photo diode may include a first doping region of high concentration, a second doping region of low concentration doped in an identical impurity as the first doping region, and a third doping region of high concentration doped in different impurity from the second doping region.

The third doping region may be enlarged to contact the first source/drain region.

In another general aspect there is provided a photo sensor module, including a semiconductor substrate, a field oxide layer, formed on the semiconductor substrate, a passive device, placed on the field oxide layer, at least one insulator film laminated on the field oxide layer, and a photo diode formed on the at least one insulator film above the passive device.

The photo sensor module may include a WELL region, formed on the semiconductor substrate, and a doping region of high concentration, formed on the WELL region.

The photo sensor module may include a metal wire formed on the insulator film, and a trench connecting the metal wire to the WELL region.

The trench may be filled with one of tungsten (W), aluminum (Al), or copper (Cu).

A doping region of the photo diode and a source/drain doping region of the WELL region may be connected with a trench.

The metal wire may surround a portion of the photo diode and a barrier metal may be formed below the metal wire.

The barrier metal may include one of titanium(Ti), titanium nitride layer(TiN), or a combination of titanium(Ti) and titanium nitride layer(TiN).

The photo sensor may include a first insulator film laminated on the field oxide layer, a second insulator film laminated on the first insulator film, a third insulator film laminated on the second insulator film, and a fourth insulator film laminated on the third insulator film, at least one first metal wire formed in the second insulator film, at least one first trench formed in the first insulator film, and the at least one first trench connecting the at least one first metal wire to a source/drain doping region of a WELL region of the semiconductor substrate, at least one second metal wire is formed on the fourth insulator film insulator, and the photo diode and at least one second trench is formed in the fourth insulator film, and the at least one second trench connecting the at least second first metal wire to the photo diode.

The third insulator film may be thinner than the other insulator films.

In another general aspect there is provided a photo sensor module, including a semiconductor substrate, a sensor section formed in the semiconductor substrate, at least one insulator film laminated on the semiconductor substrate, a photo diode placed on an upper portion of the sensor section and formed on the insulator film, and a UV shield formed between the sensor section and the photo diode.

The sensor section may be configured to sense non-UV, and the photo diode is configured to sense UV.

In another general aspect there is provided a photo sensor module, including a semiconductor substrate, a doping region of high concentration formed on the semiconductor substrate, a first field oxide layer and a second field oxide layer formed on the semiconductor substrate, a first photo diode and a second photo diode formed on the first field oxide layer and the second field oxide layer, respectively, and a portion of the first photo diode and a portion of the second photo diode contacting with the doping region of high concentration.

The photo sensor module of claim 20, wherein the first photo diode and the second photo diode are back-to-back diode.

A doping region of the first photo diode and a doping region of the second photo diode may be enlarged to reach a source/drain doping region of a WELL region of the semiconductor substrate.

The following description discloses a UV sensor that senses UV and a logic section that processes the UV sensor sensed signal simultaneously, on a semiconductor substrate. For example, when forming a poly silicon layer by deposing poly silicon on a field oxide layer or when forming a photo diode by doping impurity on the poly silicon layer, devices can be comprised under the identical process as the identical process is also applied together on a logic section. Therefore, the following description discloses a UV sensor that not only reduces the manufacture cost but also simplifies the manufacture process.

The photo sensor module of the following description discloses a photo diode, which has a predetermined doping region on a semiconductor substrate. Hence, thickness of a semiconductor substrate maybe reducible compared to a manufacture, using a traditional SOI substrate.

Additionally, the following description discloses a UV sensor that can not only place an active device or a passive device on a lower UV sensor but can also improved a structure by placing a sensor section that can sense non-UV. Thus, a UV sensor can reduce an equipped IC chip size.

Other features and aspects will be apparent from the following detailed description, the drawings, and the claims.

Figure 1:
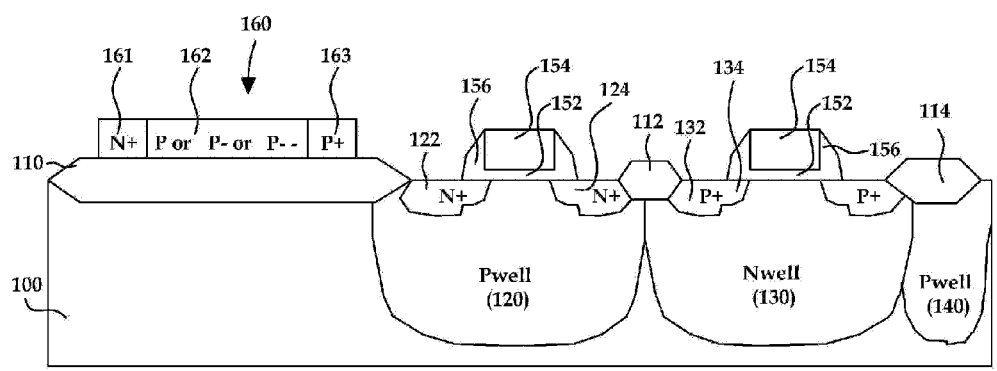
FIG. 1 is a diagram illustrating an example of a photo sensor module.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the systems, apparatuses and/or methods described herein will be apparent to one of ordinary skill in the art. The progression of processing steps and/or operations described is an example; however, the sequence of operations is not limited to that set forth herein and may be changed as is known in the art, with the exception of steps and/or operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The following description provides a photo sensor module, comprising a UV sensor which is a photo sensor, combatable with general silicon technology wherein, a ploy silicon layer, which is horizontally formed on a semiconductor substrate surface, a passive device formed on a lower UV sensor. Hence, the following description provides a photo sensor module at lower cost and having higher sensitivity sensing.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Expressions such as "first conductivity type" and "second conductivity type" as used herein may refer to opposite conductivity types such as N and P conductivity types, and examples described herein using such expressions encompass complementary examples as well. For example, an example in which a first conductivity type is N and a second conductivity type is P encompasses an example in which the first conductivity type is P and the second conductivity type is N.

FIG. 1 is a diagram illustrating an example of a photo sensor module. In FIG. 1, a semiconductor substrate 100 is a P type substrate doped with a P type impurity of low concentration. Other P type substrate, such as, for example, a P type substrate formed with a P-epi region, and the like may be used without departing from the spirit and scope of the illustrative examples described.

For separation among devices of a semiconductor substrate (100), Local Oxidation of Silicon (LOCOS), Shallow Trench Isolation (STI) and Deep Trench Isolation (DTI) or an isolation layer of a combination of, STI and DTI may be used. An isolation layer can be differentiated with a first isolation layer to a third isolation layer 110, 112, 114 and a first isolation layer to a third isolation layer 110, 112, 114 are formed of a field oxide layer. A photo diode is formed on the first field oxide layer 110, which is explained below.

A first WELL region (PWELL) 120 and a second WELL region (NWELL) 130 are formed on a semiconductor substrate 100. A first WELL region 120 is formed between a first isolation layer 110 and a second isolation layer 112, and a second WELL region 130 is formed between a second isolation layer 112 and a third isolation layer 114. A junction isolation well 140 can be formed on a side of a second WELL region 130 for separation among devices. When forming the WELL regions 120, 130, and 140 a drive-in annealing method can be processed in a high temperature of approximately over 1000° C., for dopant diffusion. Source/drain regions 122 and 132 of high concentration are formed on a first WELL region 120 and a second WELL region 130, respectively. Moreover, Lightly Doped Drain (LDD) regions 124 and 134 of low concentration are formed on source/drain regions 122 and 132 of high concentration, respectively. LDD regions 124 and 134 are formed by a blanket ion injection method. A blanket ion injection method is processed during or after a deposition of a gate electrode 154.

A gate insulator film 152 and a gate electrode 154 are formed on a first WELL region 120 and a second WELL region 130. Thickness of a gate insulator film 152 formed on the first WELL region 120 and the second WELL region 130 can be identical or different. Spacers 156 are formed on both sides of a gate electrode 154.

A photo diode 160 is formed on a first isolation layer 110 as a UV sensor. Element 160 is referred to as a UV sensor or a photo diode in the following description. A UV sensor 160 is formed by deposing poly silicon on a field oxide layer, i.e., a first isolation layer 110 that is formed on a semiconductor substrate 100. A poly silicon layer 160 senses UV when impurity is doped. In a non-exhaustive example, a UV sensor 160 includes, an N+ region 161 injected with N type impurity of high concentration, a P region (P−, P−− region) 162 injected with P type impurity of low concentration, and a P+ region 163 injected with P type impurity of high concentration. Moreover, an N+ region 161 is type N, a P region 162 and a P+ region 163 are type P, and a PN junction is formed between type N and type P. Thus, a depletion layer is formed on the P region 162 of low concentration impurity, between an N+ region and a P+ region. Electromotive force leading to a flow of electric current is generated by a light absorbed by the depletion layer. Accordingly, UV is sensed through the generation of electric current. Thickness of the N+ region 161, the P region (P−, P−− region) 162 and the P+ region 163 can be identical or different.

The UV sensor 160 in the example described above is formed in a form of a photo diode on a field oxide layer 110, which is formed on a semiconductor substrate 100 and senses UV. The manufacture process can be simplified and thickness of the IC chip can be reduced as compared to applying UV sensor on a SOI substrate.

In other examples described same reference numbers may be used in regards to identical structure but redundant explanation will be omitted.

Figure 2:
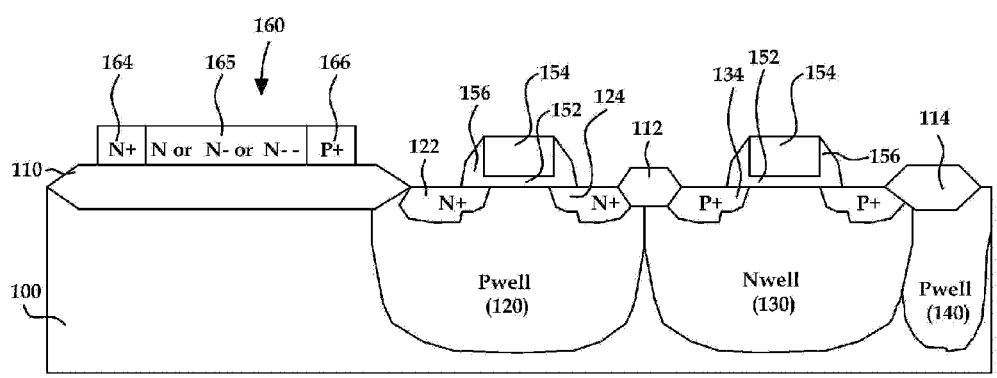
FIG. 2 is a diagram illustrating another example of a photo sensor module.

FIG. 2 is a diagram of another example of a photo sensor module.

The photo sensor module shown in the example of FIG. 2 has a structure that is similar to the photo sensor module shown in FIG. 1. The above description of FIG. 1, is also applicable to FIG. 2, and is incorporated herein by reference. Thus, the above description may not be repeated here. A doping region of a UV sensor formed on a field oxide layer in FIG. 2 is different than the doping region of a UV sensor formed on a field oxide layer in FIG. 1. FIG. 2 comprises an N+ region 164 injected of N type impurity of high concentration, an N region (N−, N−− region) 165 injected of N type impurity of low concentration, and a P+ region 166 injected of P type impurity of high concentration. Thus, a depletion layer is formed in an N region 165 of low impurity concentration, between N+ region and P+ region and an electromotive force is generated by light absorbed by the depletion layer.

Like FIGS. 1 2, a UV sensor 160 photo diode can be applied in various ways, such as, for example, N+/P/P+ or N+/N/P+, although it is not limited to the doping region. A UV sensor can be formed with a photo diode of other doping regions, which are shown in the other examples.

Figure 3:
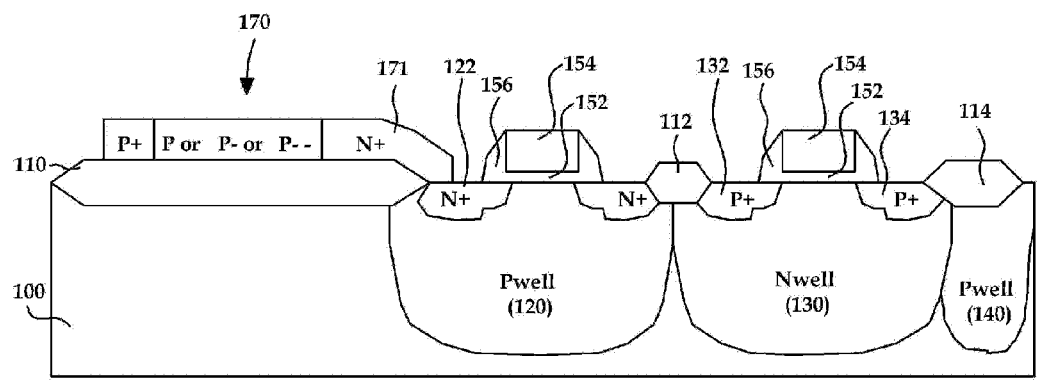
FIG. 3 is a diagram illustrating another example of a photo sensor module.

FIG. 3 is a diagram of another example of a photo sensor module.

The photo sensor module shown in the example of FIG. 3 has an structure that is similar to the photo sensor modules shown in FIGS. 1 and 2. The above description of FIGS. 1-2, is also applicable to FIG. 3, and is incorporated herein by reference. Thus, the above description may not be repeated here. In FIG. 3, a semiconductor substrate 100 is provided, a first isolation layer to a third isolation layer 110, 112, 114 are formed on a semiconductor substrate 100. A first WELL region (PWELL) to a third WELL region (NWELL) 120, 130, 140 are formed on a semiconductor substrate 100. A source/drain region 122 and 132 of high concentration are formed on a first WELL region 120 and a second WELL region 130. A gate insulator film 152, a gate electrode 154, and spacers 156 are formed on both sides of a gate electrode 154.

In the example shown in FIG. 3, doping region of a photo diode which forms a UV sensor 170, comprises a P+ region, a P/P−/P−− region, and a N+ region. Among a P+ region, a P/P−/P−− region, and an N+ region, the N+ doping region 171 adjoins a semiconductor substrate 100. The N+ doping region 171 of a photo diode is extended and contacts with a source/drain region (N+) 122 of a first WELL region 120. The N+ doping region 171 of a photo diode is formed together, generally in a deposition method, when other doping region P+ region and P/P−/P−− region are formed. Thickness of the doping regions can all be identical or different. Likewise, a photo diode formed in a deposition method is identically applied on other examples of the photo sensor module.

Thus, electromotive power is generated between a P+ region and an N+ region, in a P region of low impurity concentration and in an extended region.

Figure 4:
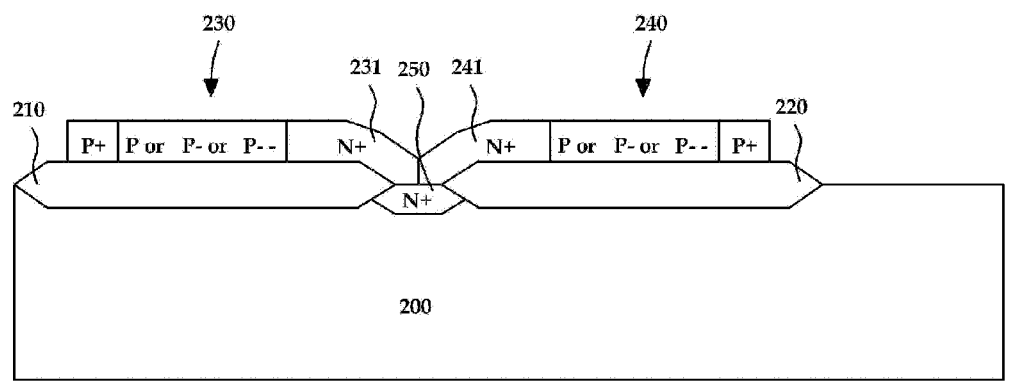
FIG. 4 is a diagram illustrating another example of a photo sensor module.
Figure 5:
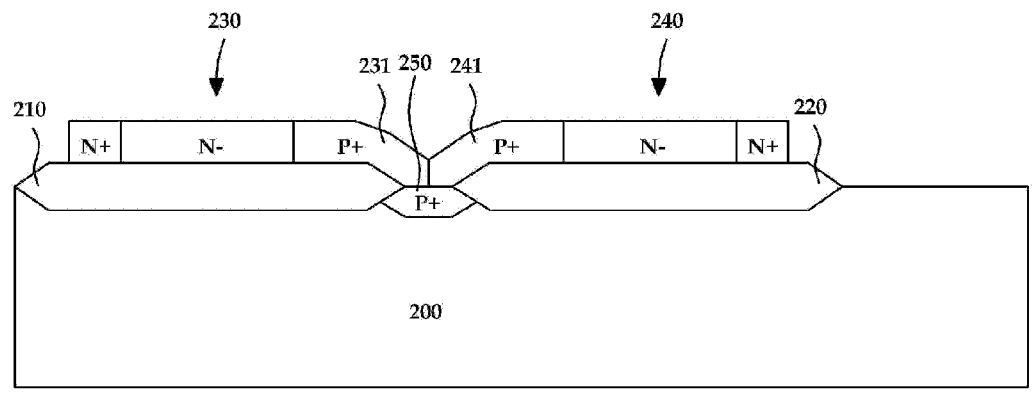
FIG. 5 is a diagram illustrating another example of a photo sensor module.

FIG. 4 is a diagram of another example of a photo sensor module and FIG. 5 is a diagram of yet another example of a photo sensor module.

In FIG. 4, a first field oxide layer 210 and a second field oxide layer 220 are symmetrically formed on a semiconductor substrate 200. A semiconductor substrate 200 is a P type substrate doped of P type impurity.

An N+ region 250 doped of N type impurity of high concentration is formed adjacent to a central part where a first field oxide layer 210 and a second field oxide layer 220 adjoin.

Photo diodes 230, 240 are symmetrically formed on the first field oxide layer 210 and on the second field oxide layer 220, respectively. A photo diode 230 formed on a first field oxide layer 210 forms an N+ doping region 231 by contacting with an N+ region 250, doped of high concentration. A P (P−, P−−) doping region and a P+ doping region are formed in order, adjacent to the N+ doping region 231. Moreover, a photo diode formed on a second field oxide layer 210 forms an N+ doping region 241 by contacting with an N+ region 250, doped of high concentration. A P (P−, P−−) doping region and a P+ doping region are formed in order, adjacent to a N+ doping region 241. In other words, N+ doping regions 231, 241 are extended and contacts with an N+ region 250. Photo diodes 230, 240 are all formed in a deposition method on a first field oxide layer 210 and the field oxide layer 220, and thickness of photo diodes 230, 240 can be identical or different.

In the example shown in FIG. 4, a doping region of photo diodes 230, 240, which comprises a UV sensor is a structure that is in contact with a semiconductor substrate 200.

Meanwhile, an example of a doping region of a UV sensor, which is formed different but with an identical structure with FIG. 4 is shown in FIG. 5. FIG. 5 shows that a first field oxide layer 210 and a second field oxide layer 220 are formed identically on a P type semiconductor substrate 200. Photo diodes 230, 240, which is a UV sensor, are formed and on a first field oxide layer 210 and a second field oxide layer 220.

Photo diodes 230, 240 of FIG. 5 comprise a different doping region from a doping region of FIG. 4. A P+ doping region, an N− doping region and an N+ doping region are formed in order on a first field oxide layer 210 and a second field oxide layer 220 according to a P+ region 250 doped of high concentration on a P type semiconductor substrate 200. P+ doping regions 231, 241 is extended to contact with the P+ region 250 doped of high concentration. A P+ region 250 is a region, doped of high concentration compared to a P type semiconductor substrate 200.

Figure 6:
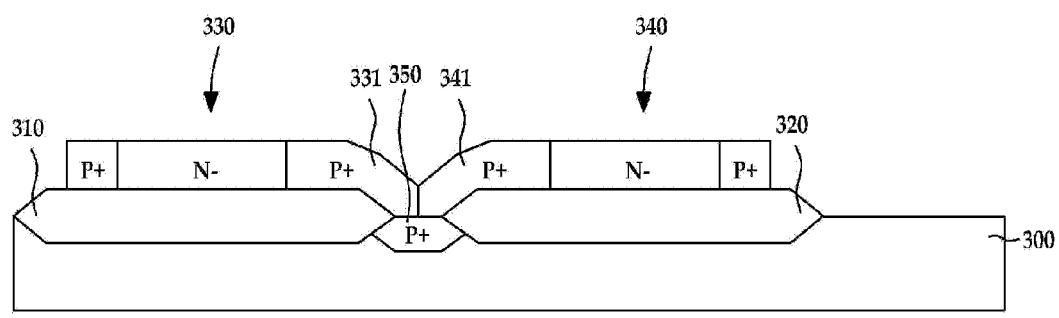
FIG. 6 is a diagram illustrating another example of a photo sensor module.

FIG. 6 is a cross sectional diagram of another example of a photo sensor module.

The photo sensor module of FIG. 6 is a structure of two photo diodes 330, 340 formed symmetrically. In FIG. 6, photo diodes 330, 340 have a P+/N−/P+ doping region using a Back-to-Back diode.

A P type semiconductor substrate 300 is provided. A first field oxide layer 310 and a second field oxide layer 320 are symmetrically formed on a semiconductor substrate 300. In a central part adjacent a first field oxide layer 310 and a second field oxide layer 320, a P+ region 350 doped of P type impurity of high concentration is formed.

Doping region of photo diodes 330, 340, which is an UV sensor with P+/N−/P+ doping region is formed on the first field oxide layer 310 and the second field oxide layer 320, respectively. A side of photo diodes 330 and 340 facing each other is extended and forms P+ doing regions 331 and 341 respectively. The P+ doing regions 331 and 341 contacts with a P+ region 350. The doping regions 331 and 341 of photo diodes 330 and 340 comprise a UV sensor and contacts with a semiconductor substrate 300.

In another example, a photo diode of an N+/P/N+ doping region, different from the P+/N−/P+ doping region can be provided. In this example, an N+ doping region is formed on a P type semiconductor substrate. The extended section of photo diode contacts with an N+ doping region of a semiconductor substrate.

Figure 7:
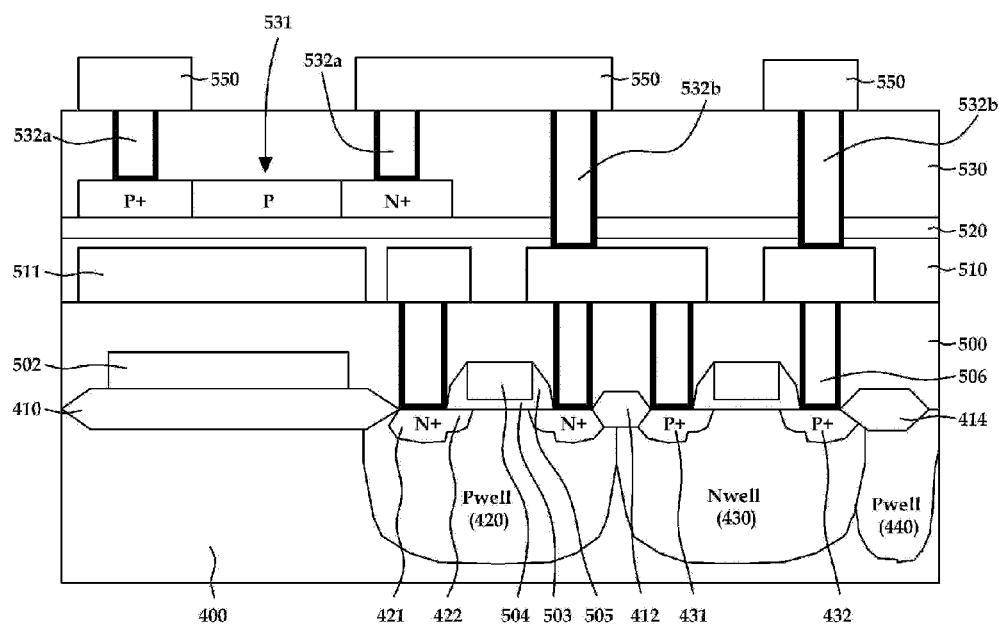
FIG. 7 is a diagram illustrating another example of a photo sensor module.

FIG. 7 is a diagram illustrating another example of a photo sensor module.

Referring to a photo sensor module of FIG. 7, semiconductor substrate 400 doped in a first P type impurity is formed.

On a semiconductor substrate 400 surface, isolation layers 410, 412, and 414 of a combination of LOCOS, STI and DTI are formed for separation of devices. In a non-exhaustive example, a first isolation layer to third isolation layer 410, 412, and 414 are field oxide layer.

A first WELL region PWELL 420 and a second WELL region NWELL 430 are formed between the first isolation layer to the third isolation layers 410, 412, and 414. A first WELL region 420 is formed between a first isolation layer 410 and a second isolation layer 412, and a second WELL region 430 is formed between a second isolation layer 412 and a third isolation layer 414. On a side of a second WELL region 430, a junction isolation well 440 can be formed for separation of devices. When forming the WELL regions 420, 430, and 440 a drive-in annealing can be processed in a high temperature of approximately over 1000° C. for dopant diffusion. On the first WELL region 420 and the second WELL region 430, source/drain regions 421 and 431 of high concentration are formed. On lower spacers 505, LDD regions 422 and 432, which are doping region of low concentration, are formed. LDD regions 422 and 432 can be formed in a blanket ion injection method.

A first insulator film to a fourth insulator film 500, 510, 520, and 530 are formed in order on a semiconductor substrate 400.

A first layer insulator film 500 is formed on a semiconductor substrate 400. A resistor 502, a gate insulator film 503, and a gate electrode 504 are formed in a first layer insulator film 500. A gate insulator film 503 and a gate electrode 504 are formed on a first WELL region 420 and a second WELL region 430. Spacers 505 are formed on both sides of a gate electrode 504. Multiple trenches 506 are formed on a first layer insulator film 500. A trench 506 connects the source/drain region 421 with a metal wire 511, which is formed on a second layer insulator film 510. A conductor is filled in a trench 506. Conductors, such as, for example, Tungsten (W), Aluminum (Al), and Copper (Cu) so on are used as a filling material. A trench 506 formed on the first layer insulator film 500 is called a 'first trench.'

A second layer insulator film 510 is formed on a first layer insulator film 500. A metal wire 511 is formed on a second layer insulator film 510. A part of a metal wire 511 is connected with a first trench 506.

A third layer insulator film 520 is formed on a second layer insulator film 520. Thickness of a third layer insulator film 520 is comparatively thinner than other layer insulator films 500, 510, and 530. This is because no structure is formed on a third layer insulator film 520 but it only serves an insulation function.

A fourth layer insulator film 530 is formed on a third layer insulator film 520. A photo diode 531, which is a UV sensor, is formed on a fourth layer insulator film 530. A photo diode 531 has a P+ region, a P (or P−, P−−) region, and a N+ doping region. A P+ region and a N+ region, herein, should be connected with a source/drain region 421, 431. For this, a metal wire 550 is formed on a fourth layer insulator film 550. A trench 532a, which connects a photo diode 531 and a metal wire 550 is formed on a fourth layer insulator film 530. A trench 532b that connects a metal wire 550 and a metal wire 511 of a second layer insulator film 510 is also formed. Trench 532b connects the metal wire 550 to the metal wire 511 via a third layer insulator film 520 and a fourth layer insulator film 530. Trenches 532a and 532b formed on a fourth layer insulator film 530 is called a 'second trench.' Trenches 532a and 532b, unlike a form of a first trench, can be formed in a via form according to thickness of a layer insulator film.

In this example shown in FIG. 7, a photo diode 531 is absorbed in a P region of low concentration that is formed between a P+ region and an N+ region when the light is irradiated from above. Electromotive power is generated by absorbed light, and the photo diode 531 senses UV, using change of electromotive power. In this example, a photo diode 531, which is a UV sensor is formed on a fourth layer insulator film 530, separated from a semiconductor substrate 400. A resistor 502, which is a passive device, is formed on a first isolation layer 410, thus, a passive device and a UV sensor are placed vertically.

Figure 8:
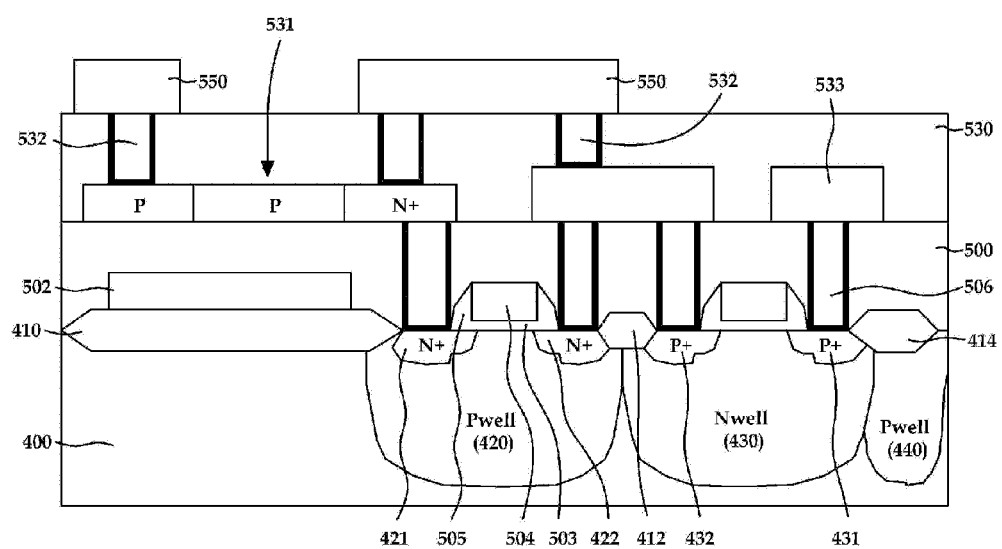
FIG. 8 is a diagram illustrating another example of a photo sensor module according to the eighth embodiment of the present invention.

FIG. 8 is a cross sectional diagram of another example of a photo sensor module. The example of FIG. 8 is different from the example shown in FIG. 7 because a second layer insulator film and a third layer insulator film are not formed in the example shown in FIG. 8.

A photo diode 531, which is a UV sensor, is a structure of source/drain regions 421, 431, metal wires 533, 550, and trenches 506, 532 that are connected with each other. An N+ doping region of a photo diode 531 is directly connected with a source/drain region 421 of a first WELL region 420 via a trench 506.

In the case of the eighth embodiment, a UV sensor is placed on an upper passive device.

Figure 9:
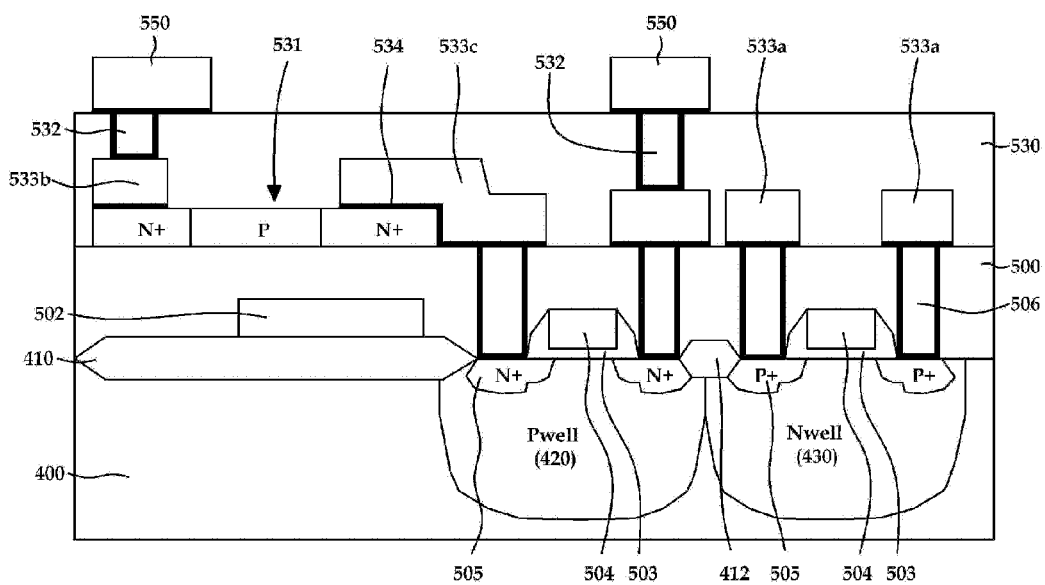
FIG. 9 is a diagram illustrating another example of a photo sensor module.

FIG. 9 is a cross sectional diagram of another example of a photo sensor module.

Referring to the photo sensor module of FIG. 9, a first layer insulator film 500 and a second layer insulator film 530 are included on a semiconductor substrate 400.

A first WELL region 420 and a second WELL region 430 are formed on a semiconductor substrate 400. A source/drain region 505 is formed on a first WELL region 420 and a second WELL region 430. Moreover, with reference to FIG. 7, a second isolation layer 412 is formed on a semiconductor substrate 400, between a first isolation layer 410, the first WELL region 420, and a second WELL region 430.

On a first layer insulator film 500, a resistor 502, a gate electrode 504, and a gate insulator film 503 are formed. A plurality of a first trench 506 are formed. This is identical to the other recited examples, the description of which are incorporated herein by reference. Thus, the above description may not be repeated here.

A photo diode 531, which is a UV sensor, is formed on a second layer insulator film 530. A photo diode 531 comprises N+/P (P−, P−−) N+ doping region. In a second layer insulator film 530, metal wires 533a, 533b, 533c are provided, and a part of metal wires 533b, 533c are placed on an N+ region of a photo diode 531. A metal wire 533c is formed in a stair shape and surrounds an N+ doping region. On lower side of a metal wire 533c, a barrier metal 534 is formed of titanium (Ti), titanium nitride layer (TiN) or a combination (TiN) of titanium (Ti) and titanium nitride layer (TiN).

An N+ doping region of a UV sensor is directly connected with a source/drain region 505 of a first WELL region 420.

Since a second trench 532 is also formed on a second layer insulator film 530, a second layer insulator film 530 is connected with a metal wire 550, formed on upper portion of the second layer insulator film 530, or with a first trench 506.

Figure 10:
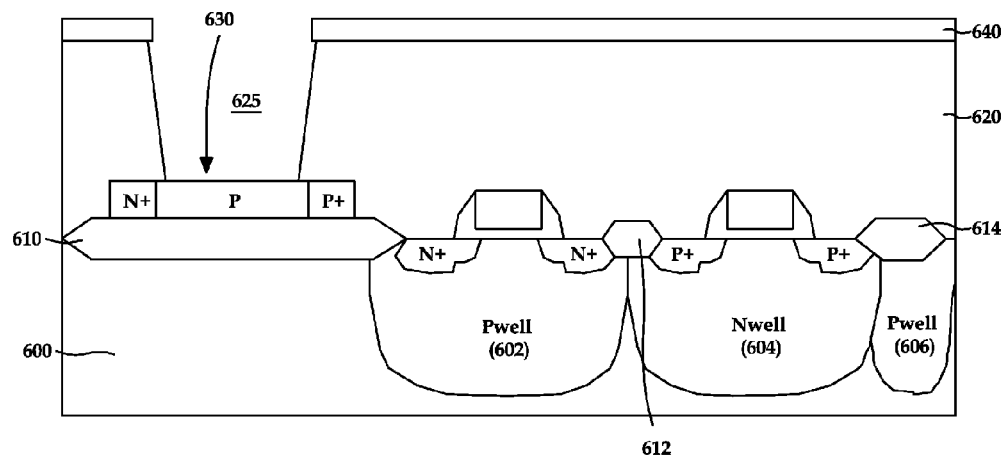
FIG. 10 is a diagram illustrating another example of a photo sensor module.

FIG. 10 is a cross sectional diagram of another example of a photo sensor module.

The photo sensor module of FIG. 10 provides a semiconductor substrate 600. WELL regions 602, 604, and 606 and isolation layers 610, 612, and 614 are formed on the semiconductor substrate 600. A photo diode 630, a UV sensor, which has a N+/P/P+ doping region is formed on a first insolation layer 610.

On a upper semiconductor substrate 600, a layer insulator film 620 is formed. A layer insulator film 620 can be thicker than thickness of a semiconductor substrate 600. A part of a layer insulator film 620 has a region 625 that is removed. A part of a P doping region of a photo diode 530 is exposed by the removed region 625.

A passivation layer 640 is formed on a layer insulator film 620.

Figure 11:
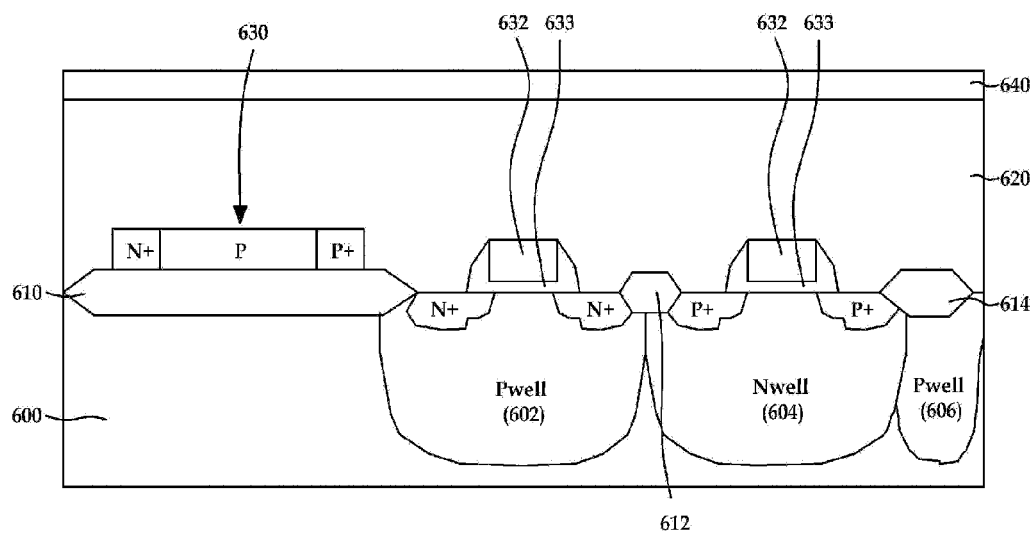
FIG. 11 is a diagram illustrating another example of a photo sensor module.

FIG. 11 is a cross sectional diagram of another example of a photo sensor module. Compared to the example of FIG. 10, a part of a layer insulator film 620 is not removed in FIG. 11.

Isolation layers 610, 612, 614 are formed on a semiconductor substrate 600 wherein WELL regions 602, 604, 606 are formed. A photo diode 630 is formed on an isolation layer 610 of a semiconductor substrate 600. A gate electrode 632 and a gate insulator film 633 are formed on a semiconductor substrate 600. A layer insulator film 620 is formed on the semiconductor substrate 600, including a photo diode 630, a gate electrode 632 and a gate insulator film 633. A passivation layer 640 is laminated on a layer insulator film 620. A passivation layer 640 maximizes UV transmissivity.

Figure 12:
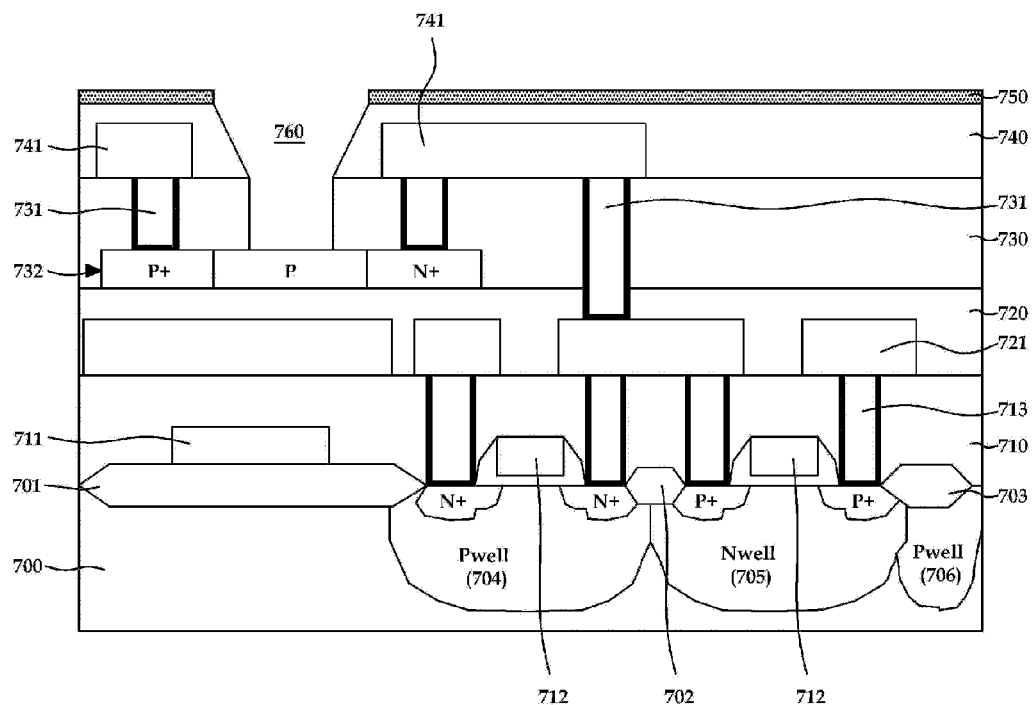
FIG. 12 is a diagram illustrating another example of a photo sensor module.

FIG. 12 is a cross sectional diagram of another example of a photo sensor module.

FIG. 12 also has a similar structure in some parts compared to the other examples, for example, FIG. 12 has similar structure as that of FIG. 7. The above description of the similar structures of FIG. 7 is incorporated herein by reference in FIG. 12. Thus, the above description may not be repeated here.

Referring to FIG. 12, a first layer insulator film to a fourth layer insulator film 710, 720, 730, 740 are laminated in order on a semiconductor substrate 700.

On a semiconductor substrate 700, a first insulator film to a third insulator film 701, 702, 703 are formed and WELL regions 704, 705, 706 are formed according to the insulator films 701, 702, 703. A resistor 711, a gate electrode 712, and a first trench 713 are formed on a first layer insulator film 710. Metal wires 721 are formed on a second layer insulator film 720. A photo diode 732 and second trenches 731 are formed on a third layer insulator film 730. Metal wires 741 connected with second trenches 731 are formed on a fourth layer insulator film 740. A passivation layer 750 is formed on a fourth layer insulator film 740.

FIG. 12 provides a structure that exposes a sensing region of a photo diode 732 to the outside. This is because a part of region 760 of a third layer insulator film 730, a fourth layer insulator film 740, and a passivation layer 740 is removed by an etching process. A photo sensor module can also be manufactured in this structure.

Figure 13:
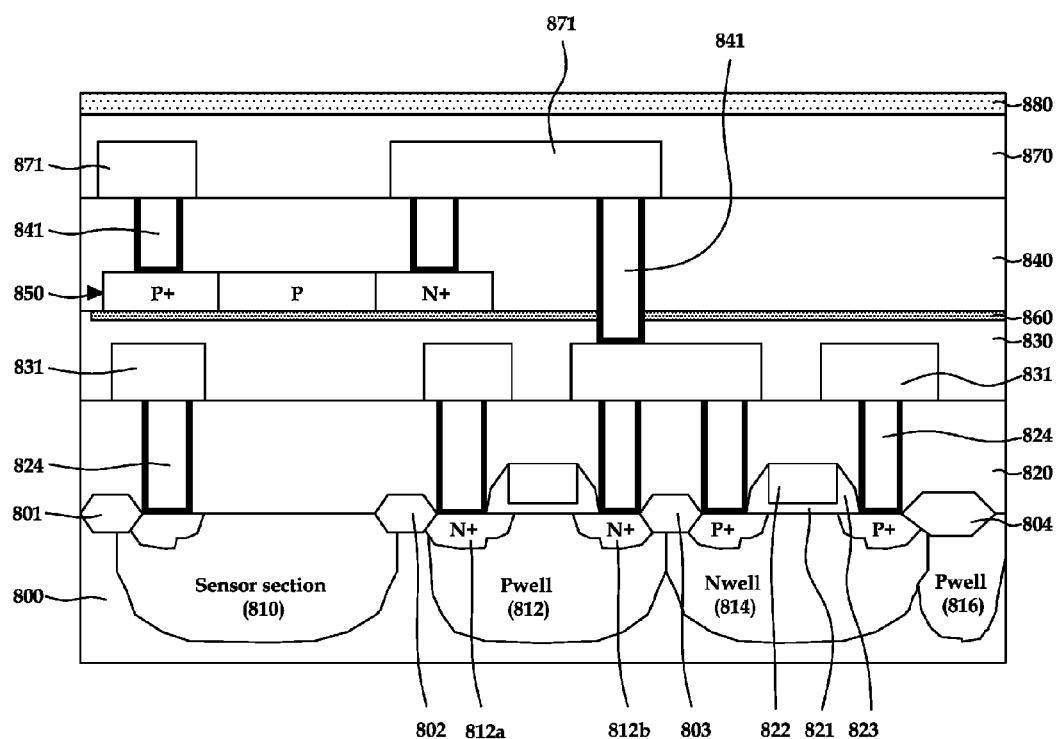
FIG. 13 is a diagram illustrating another example of a photo sensor module.

With reference to FIG. 13, a photo sensor module can provide sensing function, which simultaneously senses UV and non-UV.

FIG. 13 is a drawing of another example of a photo sensor module. A semiconductor substrate 800 is shown in FIG. 13.

To separate the devices, isolation layers of LOCS, STI DTI or a combination of LOCS, STI and DTI are formed on a semiconductor substrate 800. An isolation layer can be differentiated with a first isolation layer to a fourth isolation layer 801, 802, 803, 804. A sensor section 810, sensing non-UV, is formed between a first isolation layer 801 and a second isolation layer 802; a first WELL region (PWELL) 812 is formed between a second isolation layer 802 and a third isolation layer 803; a second WELL region (NWELL) 814 is formed between a third isolation layer 803 and a fourth isolation layer 804. A source/drain region 812a of high concentration and a LDD region 812b of low concentration doping region, are formed on a first WELL region 812 and a second WELL region 814. Further, a junction isolation well 816 is formed on a side of a second WELL region 814.

A first layer insulator layer (IMD: Inter metal dielectric) 820 is formed on a semiconductor substrate 800. A gate insulator film 821 and a gate electrode 822 are formed on a first layer insulator film 820 in a corresponding region of a first WELL region 812 and a second WELL region 814. Spacers 823 are formed on each side of a gate electrode 822. First trenches 824 are formed corresponding with a source/drain region 812a on a first layer insulator film 820. Conductor such as, for example, tungsten (W), aluminum (Al), and copper (Cu) is filled in a first trench 824.

A second layer insulator film (ILD: Inter layer dielectric) 830 is formed on a first layer insulator film 820. Metal wire 831 is formed corresponding with a first trench 824 on a second layer insulator film 830.

A third layer insulator film (ILD: Inter layer dielectric) 840 is formed on a second layer insulator film 830. A photo diode 850 and a UV sensor is formed on a third layer insulator film 840. A photo diode 850 comprises P+/P/N+ doping region and is placed on a section corresponding to the upper sensor section 810 formed on the semiconductor substrate 800. Second trenches 841 are also formed on a third layer insulator film 840.

A UV Block layer 860 is formed between a second layer insulator film 830 and a third layer insulator film 840. A UV Block layer 860 blocks UV and only transmits non-UV. A sensor section 810, which is formed on a semiconductor substrate 800, senses non-UV.

A fourth layer insulator film 870 is formed on a third layer insulator film 840 and a metal wire 871 is formed on the fourth layer insulator film 870. A metal wire 871 is connected with a photo diode 850 using second trenches 841 or is connected with a metal wire 831 of a second layer insulator film 830.

A passivation layer 880 is formed on a fourth layer insulator film 870. In the example shown in FIG. 13, a photo diode 850 senses UV and a sensor section 810 formed on lower photo diode 850 senses non-UV.

The examples disclosed in the description above use poly silicon layer grown on a semiconductor substrate as a UV sensor and provides a photo sensor module of improved structure of other sensor section or a passive device that can sense non-UV, placed on a lower section of a UV sensor.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A photo sensor module, comprising:
   a semiconductor substrate;
   a field oxide layer, formed on the semiconductor substrate;
   a passive device, placed on the field oxide layer;
   at least one insulator film laminated on the field oxide layer; and
   a photo diode formed on the at least one insulator film above the passive device.

2. The photo sensor module of claim 1, further comprising:
   a WELL region, formed on the semiconductor substrate; and
   a doping region of high concentration, formed on the WELL region.

3. The photo sensor module of claim 1, further comprising a metal wire formed on the insulator film, and a trench connecting the metal wire to the WELL region.

4. The photo sensor module of claim 3, wherein the trench is filled with one of tungsten (W), aluminum (Al), or copper (Cu).

5. The photo sensor module of claim 3, wherein a doping region of the photo diode and a source/drain doping region of the WELL region are connected with a trench.

6. The photo sensor module of claim 3, wherein:
   the metal wire surrounds a portion of the photo diode and a barrier metal is formed below the metal wire.

7. The photo sensor module of claim 6, wherein the barrier metal comprises one of titanium(Ti), titanium nitride layer(TiN), or a combination of titanium(Ti) and titanium nitride layer(TiN).

8. The photo sensor module of claim 1, further comprising:
a first insulator film laminated on the field oxide layer, a second insulator film laminated on the first insulator film, a third insulator film laminated on the second insulator film, and a fourth insulator film laminated on the third insulator film;
at least one first metal wire formed in the second insulator film;
at least one first trench formed in the first insulator film, and the at least one first trench connecting the at least one first metal wire to a source/drain doping region of a WELL region of the semiconductor substrate;
at least one second metal wire is formed on the fourth insulator film insulator; and
the photo diode and at least one second trench is formed in the fourth insulator film, and the at least one second trench connecting the at least second first metal wire to the photo diode.

9. The photo sensor module of claim 8, wherein the third insulator film is thinner than the other insulator films.

10. A photo sensor module, comprising:
a semiconductor substrate;
a sensor section formed in the semiconductor substrate;
at least one insulator film laminated on the semiconductor substrate;
a photo diode placed on an upper portion of the sensor section and formed on the insulator film; and
a UV shield formed between the sensor section and the photo diode.

11. The photo sensor module of claim 10, wherein:
the sensor section is configured to sense non-UV, and
the photo diode is configured to sense UV.

12. A photo sensor module, comprising:
a semiconductor substrate;
a doping region of high concentration formed on the semiconductor substrate;
a first field oxide layer and a second field oxide layer formed on the semiconductor substrate;
a first photo diode and a second photo diode formed on the first field oxide layer and the second field oxide layer, respectively; and
a portion of the first photo diode and a portion of the second photo diode contacting with the doping region of high concentration.

13. The photo sensor module of claim 12, wherein the first photo diode and the second photo diode are back-to-back diode.

14. The photo sensor module of claim 12, a doping region of the first photo diode and a doping region of the second photo diode are enlarged to reach a source/drain doping region of a WELL region of the semiconductor substrate.

* * * * *